United States Patent
Hong et al.

(10) Patent No.: US 10,344,395 B2
(45) Date of Patent: Jul. 9, 2019

(54) APPARATUS AND METHOD FOR GROWING SILICON SINGLE CRYSTAL INGOT

(71) Applicant: SK SILTRON CO., LTD., Gumi-si Gyeongsangbuk-do (KR)

(72) Inventors: Young Ho Hong, Gumi-si (KR); Hyun Woo Park, Gumi-si (KR); Su Jin Son, Gumi-si (KR); Nam Seok Kim, Gumi-si (KR)

(73) Assignee: SK SILTRON CO., LTD., Gumi-si (KR)

( * ) Notice: Subject to any disclaimer, the term of this patent is extended or adjusted under 35 U.S.C. 154(b) by 0 days.

(21) Appl. No.: 15/564,045

(22) PCT Filed: Apr. 12, 2016

(86) PCT No.: PCT/KR2016/003841
§ 371 (c)(1),
(2) Date: Oct. 3, 2017

(87) PCT Pub. No.: WO2016/167542
PCT Pub. Date: Oct. 20, 2016

(65) Prior Publication Data
US 2018/0094359 A1    Apr. 5, 2018

(30) Foreign Application Priority Data

Apr. 14, 2015    (KR) .................. 10-2015-0052307

(51) Int. Cl.
*C30B 15/10*    (2006.01)
*C30B 15/20*    (2006.01)
(Continued)

(52) U.S. Cl.
CPC ............. *C30B 15/10* (2013.01); *C30B 15/14* (2013.01); *C30B 15/20* (2013.01); *C30B 15/305* (2013.01); *C30B 29/06* (2013.01)

(58) Field of Classification Search
CPC ......... C30B 15/00; C30B 15/10; C30B 15/22; C30B 15/30; C30B 29/06
See application file for complete search history.

(56) References Cited

U.S. PATENT DOCUMENTS

| | | | |
|---|---|---|---|
| 5,306,387 A * | 4/1994 | Fusegawa | C30B 29/06 117/13 |
| 2008/0286565 A1* | 11/2008 | Koike | C30B 15/206 428/332 |
| 2015/0147258 A1* | 5/2015 | Hong | C30B 15/00 423/348 |

FOREIGN PATENT DOCUMENTS

| JP | H08-231294 | 9/1996 |
|---|---|---|
| JP | 2003-321297 | 11/2003 |

(Continued)

OTHER PUBLICATIONS

International Search Report (with English Translation) and Written Opinion dated Jul. 22, 2016 issued in Application No. PCT/KR2016/003841.

(Continued)

*Primary Examiner* — Robert M Kunemund
(74) *Attorney, Agent, or Firm* — KED & Associates, LLP (57) ABSTRACT

Provided is a silicon single crystal ingot growing apparatus of an embodiment, including: a chamber; a crucible provided inside the chamber to accommodate silicon melt; a rotating shaft and a crucible support disposed at a lower portion of the crucible; a heater provided inside the chamber to heat the silicon melt; a pulling unit for rotating and pulling up an ingot grown from the silicon melt; and a magnetic field generating unit for applying a horizontal magnetic field to the crucible, wherein a first direction in which the rotating shaft rotates the crucible and a second direction in which the pulling unit rotates the ingot are the same.

6 Claims, 7 Drawing Sheets

(51) Int. Cl.
    *C30B 29/06*  (2006.01)
    *C30B 15/14*  (2006.01)
    *C30B 15/30*  (2006.01)

(56) References Cited

FOREIGN PATENT DOCUMENTS

| | | |
|---|---|---|
| JP | 2005-015314 | 1/2005 |
| JP | 2007-084417 | 4/2007 |
| JP | 2008-019129 | 1/2008 |
| JP | 2008-214118 | 9/2008 |
| JP | 2010-024120 | 2/2010 |
| JP | 2014-214067 | 11/2014 |
| JP | H09-208385 | 8/2017 |
| KR | 10-0239864 | 1/2000 |
| KR | 10-0954291 | 4/2010 |
| KR | 10-2010-0089457 | 8/2010 |
| KR | 10-1379798 | 4/2014 |
| WO | WO 2013/176396 | 4/2013 |

OTHER PUBLICATIONS

Japanese Office Action issued in Application 2018-504631 dated Feb. 20, 2019.

\* cited by examiner

APPARATUS AND METHOD FOR GROWING SILICON SINGLE CRYSTAL INGOT

CROSS-REFERENCE TO RELATED PATENT APPLICATIONS

This application is a U.S. National Stage Application under 35 U.S.C. § 371 of PCT Application No. PCT/KR2016/003841, filed Apr. 12, 2016, which claims priority to Korean Patent Application No. 10-2015-0052307, filed Apr. 14, 2015, whose entire disclosures are hereby incorporated by reference.

TECHNICAL FIELD

The embodiment relates to an apparatus and a method for growing a silicon single crystal ingot and more particularly, is to secure a uniformity of oxygen concentration in diameter and radial directions in a silicon single crystal ingot.

BACKGROUND ART

In general, a silicon wafer is formed by a single crystal growing process for manufacturing a single crystal ingot, a slicing process for obtaining a thin disk-shaped wafer by slicing the single crystal ingot, a grinding process for machining an outer peripheral portion of a wafer to prevent cracking and distortion of the wafer obtained by the slicing process, a lapping process for removing damages due to mechanical processing remaining on the wafer, a polishing process for polishing the wafer, and a cleaning process for removing an abrasive or an foreign substance adhering to the wafer while polishing the polished wafer.

For a single crystal growth, a floating zone (FZ) method or a Czochralski (CZ) method (hereinafter referred to as CZ method) has been widely used. The CZ method is the most common method among these methods.

In the CZ method, a polycrystalline silicon is charged in a quartz crucible and heated and melted by a graphite heating element, and then a single crystal silicon ingot is grown by pulling up a seed crystal while rotating the seed crystal when the seed crystal is immersed in silicon melt formed as a result of melting and crystallization occurs at an interface.

In particular, oxygen is included in a silicon single crystal as crystal defects due to growth history and undesired impurities in a growing process of the silicon single crystal, and thus intruded oxygen in this manner is grown into oxygen precipitate due to heat applied during a manufacturing process of a semiconductor device. Although the oxygen precipitate shows beneficial characteristics such as reinforcing the strength of the silicon wafer and capturing metal pollution elements and serving as an internal gettering site, a leakage current and a fail of the semiconductor device are caused.

Accordingly, oxygen concentration of a wafer manufactured from the silicon single crystal ingot needs to be uniform in longitudinal and radial directions, and the oxygen concentration may be controlled through a seed rotating speed, a crucible rotating speed, a melt gap, which is the distance between a melt surface and a heat shield, a pull speed of the ingot, a design change of hot zone, a third element doping such as nitrogen or carbon, which are process variables when growing a silicon single crystal ingot.

However, in the case of a wafer obtained from a silicon single crystal ingot currently manufactured, in particular, a region where the oxygen concentration is non-uniform in a ring shape is found at an edge, which may be caused by non-uniformity of the internal gettering property described above.

DISCLOSURE

Technical Problem

The embodiment is directed to providing a method for growing a silicon single crystal to secure a uniformity of oxygen concentration in longitudinal and radial directions.

Technical Solution

An embodiment provides an apparatus for growing a silicon single crystal ingot, including: a chamber; a crucible provided inside the chamber to accommodate silicon melt; a rotating shaft and a crucible support disposed at a lower portion of the crucible; a heater provided inside the chamber to heat the silicon melt; a pulling unit for rotating and pulling up an ingot grown from the silicon melt; and a magnetic field generating unit for applying a horizontal magnetic field to the crucible, wherein a first direction in which the rotating shaft rotates the crucible and a second direction in which the pulling unit rotates the ingot are the same.

The heater may heat the periphery of the crucible so that a maximum heat generating position is formed below a maximum gauss position (MGP).

The heater may heat the periphery of the crucible so that a maximum heat generating position is formed at 100 to 200 mm below the MGP.

The heater and the pulling unit may heat the crucible so that a diffusion boundary layer is uniformly distributed at an edge of a radial direction of the silicon melt and may pull up the ingot.

The heater and the pulling unit may heat the crucible so that the diffusion boundary layer is formed at 12 mm below a surface of the silicon melt and may pull up the ingot.

The heater and the pulling unit may heat the crucible so that the diffusion boundary layer is distributed over a diameter of 300 mm or more from an edge of the silicon melt and may pull up the ingot.

Another embodiment is directed to providing a method for growing a silicon single crystal ingot in which an ingot and a crucible are rotated in the same direction and a maximum heat generating position is below a maximum gauss position (MGP).

A diffusion boundary layer may be uniformly distributed at an edge in a radial direction of silicon melt.

The diffusion boundary layer may be distributed 12 mm below a surface of the silicon melt, in a region of diameter of 300 mm or more.

A flow of the silicon melt may be constant in a depth direction in the silicon melt.

A maximum heat generating position may be located 100 to 200 mm lower than the MGP.

Advantageous Effects

When the silicon single crystal ingot is grown by the process described above, it can be seen that the flow of the silicon melt may be constant, the diffusion boundary layer may be distributed at an edge of the ingot, and the oxygen concentration of the manufactured silicon wafer may be constant, and thus resistivity may be improved.

MODES OF THE INVENTION

Hereinafter, embodiments are provided in order to fully explain the invention, and will be described in detail with reference to accompanying drawings to help understanding of the invention. The embodiments may, however, be embodied in many different forms and are not to be construed as being limited to the embodiments set forth herein; rather, these embodiments are provided so that this disclosure is thorough and complete, and fully conveys the concept of embodiments to those skilled in the art.

In the description of embodiments, it should be understood that when an element is referred to as being "on or under" another element, the term "on or under" refers to either a direct connection between two elements or an indirect connection between two elements having one or more elements formed therebetween. In addition, when the term "on or under" is used, it may refer to a downward direction as well as an upward direction with respect to an element.

Further, the relational terms such as "first" and "second," "over/upper portion/above," and "below/lower portion/under" do not necessarily require or include any physical or logical relationship or sequence between devices or elements, and may also be used only to distinguish one device or element from another device or element.

Thicknesses of layers and areas in the drawings may be exaggerated, omitted, or schematically described for a convenient and precise description. In addition, the size of each component does not fully match the actual size thereof.

Figure 1:
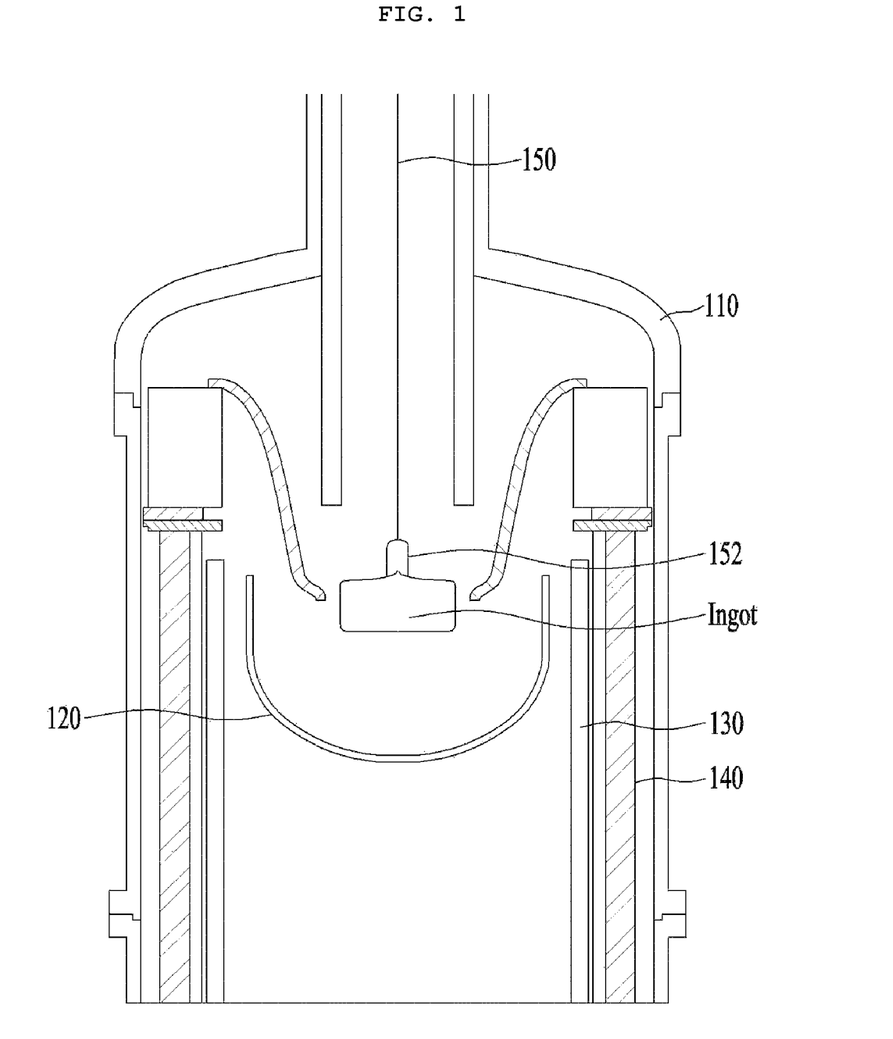
FIG. 1 is a view illustrating an apparatus of manufacturing a single crystal ingot according to an embodiment.

FIG. 1 is a view illustrating an apparatus of manufacturing a single crystal ingot according to an embodiment.

According to the embodiment, an apparatus of manufacturing a silicon single crystal ingot 100 may include a chamber 110, a crucible 120, a heater 130, a pulling unit 150, and the like. In detail, an apparatus of manufacturing a silicon single crystal ingot 100 according to the embodiment may include the chamber 110, the crucible 120 provided in the chamber 110 to receive a silicon melt, the heater 130 provided in the chamber 110 and configured to heat the crucible 120, and a pulling unit 150 coupled to a seed crystal 152 at one end thereof, and a magnetic field generating unit (not shown) to apply a horizontal magnetic field to the crucible 120.

The chamber 110 provides a space in which predetermined processes for growing the single crystal ingot for a silicon wafer used as an electronic component material such as a semiconductor are performed.

A radiant insulator 140 may be installed on an inner wall of the chamber 110 to prevent heat of the heater 130 from being radiated to a side wall of the chamber 110.

In order to control oxygen concentration at the time of growing the silicon single crystal, various factors such as a rotating speed of the crucible 120 or a pressure condition inside the chamber 110 may be controlled. For example, according to the embodiment, argon gas or the like may be injected into the chamber 110 of the silicon single crystal growing apparatus to control the oxygen concentration and then be discharged downward.

The crucible 120 is provided inside the chamber 110 to contain silicon melt and may be made of quartz or the like. A crucible support (not shown) made of graphite may be provided on the outside of the crucible 120 to support the crucible 120. The crucible support is fixedly installed on a rotating shaft (not shown), and the rotating shaft is rotated by a driving unit (not shown) to rotate and elevate the crucible 120, so that a solid-liquid interface, that is, the interface between the solidified ingot and the silicon melt, may maintain the same height.

Further, the rotating shaft may rotate in a first direction for rotating the crucible, and the pulling unit may rotate in a second direction for rotating the ingot, wherein the first direction and the second direction may be the same.

The heater 130 may be provided inside the chamber 110 to heat the crucible 120. For example, the heater 130 may have a cylindrical shape surrounding the crucible support. The heater 130 melts a high-purity polycrystalline silicon ingot placed in the crucible 120 which may be formed into silicon melt.

The crucible 120 is heated by heat supplied from the heater 130. The temperature in each region may vary depending on the height of the crucible 120, and a region having the highest temperature may correspond to a maximum heat generating position of the heater 130.

In a manufacturing method for growing a silicon single crystal ingot according to an embodiment, a Czochralski (CZ) method for growing a crystal by immersing a seed crystal 152 which is a single crystal in silicon melt and slowly pulling up the seed crystal 152 to grow a crystal may be employed.

The CZ method is described in detail as follows.

A necking process is performed to grow elongated crystals from the seed crystal 152, then the crystal is grown in a diameter direction and subjected to a shouldering process to make a target diameter, after a body growing process is performed to grow crystals having a predetermined diameter, after the body growing has progressed by a certain length, the diameter of the crystal is gradually reduced, and finally a tailing process is performed to separate the crystal from the molten silicon, thereby completing the growth of the single crystal.

According to the embodiment, B (boron), which is a P-type dopant and As (arsenic), P (phosphorus), Sb (antimony) or the like, which are N-type dopants, may be doped in the silicon melt. When high concentration of dopant is introduced, a growth rate/temperature gradient (V/G), that is, the rate of growth of the ingot relative to the temperature gradient may be changed depending on the dopant concentration. Accordingly, oxygen concentration may be changed within an interior, particularly a body region of the ingot.

According to the embodiment, an ingot and a crucible are rotated in the same direction at the time of growing the ingot, a heater is arranged so that a maximum heat generating position is below a maximum gauss position (MGP), and thus oxygen concentration in longitudinal and radial directions (in-plane direction) of the ingot may be constant, and resistivity of the wafer to be produced may be constant.

In detail, a magnetic field is applied to the periphery of the crucible 120 by the magnetic field applying unit, and a region having the strongest magnetic field intensity may be referred to as a maximum gauss position (MGP). At this point, the heater and the magnetic field may heat the periphery of the crucible 120 and apply a magnetic field to the periphery of the crucible so that a maximum heat generating position is formed below the maximum gauss position (MGP). In detail, the maximum heat generating position may be formed at a position 100 to 200 mm below the MGP.

Figure 2:
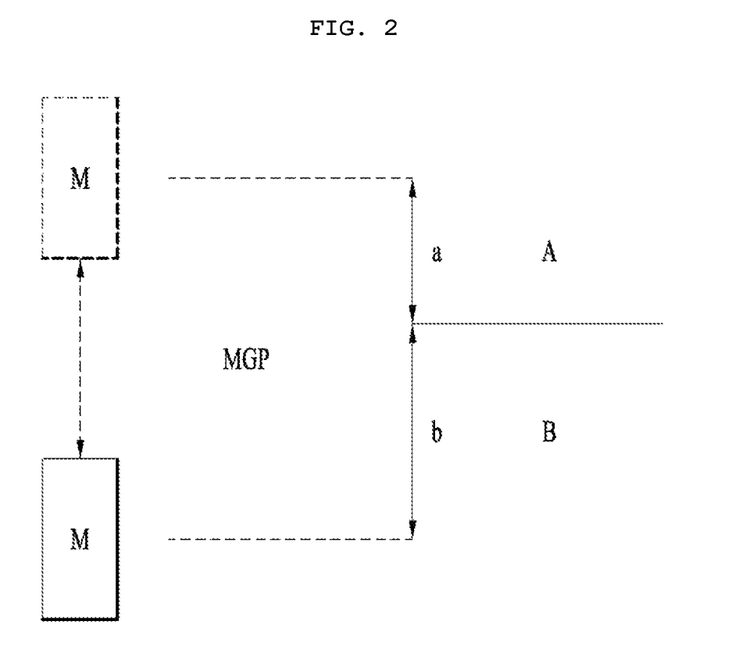
FIG. 2 is a diagram illustrating a shift of a maximum gauss position (MGP) at the time of growing a silicon single crystal ingot.

FIG. 2 is a diagram illustrating a shift of a maximum gauss position (MGP) at the time of growth of a silicon single crystal ingot.

In FIG. 2, a maximum gauss point (MGP) may move up and down from an interface between 'A', which is a region inside the crucible, and 'B', which is a region of an upper chamber, and the MGP may move within a range of 'a' in the 'A' direction and 'b' in the 'B' direction from the above interface. At this point, the maximum heat generating position of the heater may be lower than the MGP described above.

Figure 3:
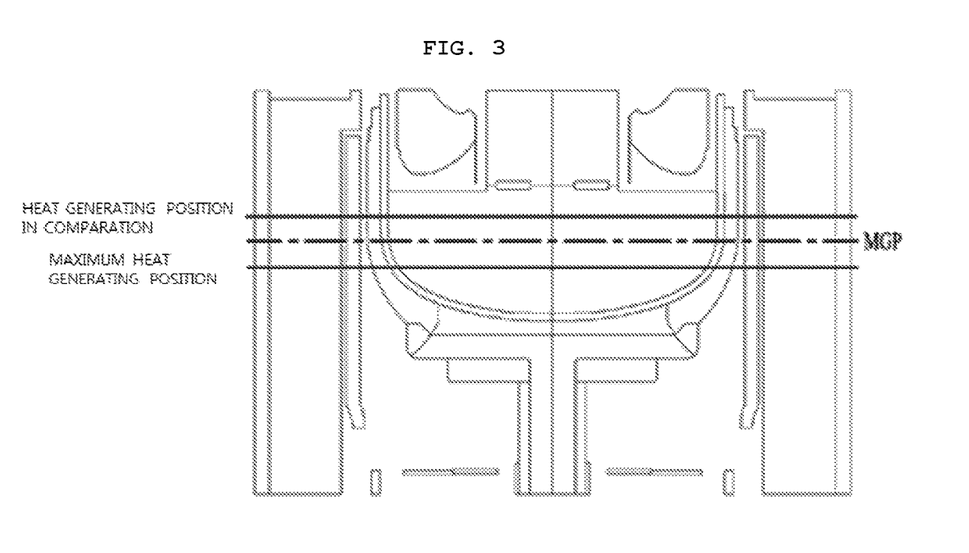
FIG. 3 is a view illustrating a conventional maximum heat generating position and a maximum heat generating position according to an embodiment.

FIG. 3 is a view illustrating a conventional maximum heat generating position and a maximum heat generating position according to an embodiment.

In an embodiment, as shown in the figure, a maximum heat generating position is at a lower portion than that of the related art and in particular, the maximum heat generating position may be at a distance D of 100 to 200 mm lower than the MGP. At this point, a flow of the silicon melt may be changed.

If the maximum heat generating position is 200 mm or more below the MGP, the flow above the silicon melt may become a turbulence, and if the maximum heat generating position is below to 100 mm, the flow under the silicon melt may become a turbulence.

In an embodiment, a maximum heat generating position may be at 100 mm to 200 mm below the MGP so that the flow in a depth direction of the silicon melt, that is, in the vertical direction in FIG. 1, may be constant.

In order to secure a high gettering and a uniformity of the silicon wafer manufactured from the ingot to be grown, it is advantageous that oxygen concentration in the ingot is constant in longitudinal and radial directions. For this, a diffusion boundary layer may be distributed at a depth of about 12 mm from a surface of the growing silicon melt, in a region outside the diameter of about 300 mm. In a method of growing a silicon single crystal ingot according to an embodiment, the diffusion boundary layer in the silicon melt may be uniformly distributed at an edge of a radial direction, and the diffusion boundary layer may be confirmed by measuring the temperature of the silicon melt.

At this point, the heater and the pulling unit may heat the crucible so that a diffusion boundary layer is uniformly distributed at an edge of the radial direction of the silicon melt and may pull up the ingot. In detail, the heater and the pulling unit may heat the crucible so that the diffusion boundary layer is formed at 12 mm below a surface of the silicon melt and may pull up the ingot.

In detail, a diffusion boundary layer is a region having a diffusion rate of about $10^{-8}$ m$^2$/sec. In the embodiment, at a temperature of about 1700 Kelvin, the diffusion boundary layer may be at the maximum diameter of 320 mm.

Figure 4A:
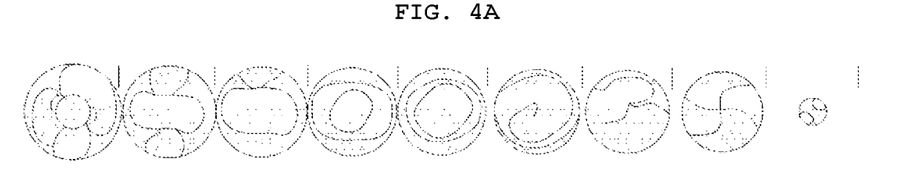
FIGS. 4A to 4C are views illustrating a flow of silicon melt together with a comparative example in a method for growing a silicon single crystal ingot according to an embodiment.
Figure 4B:
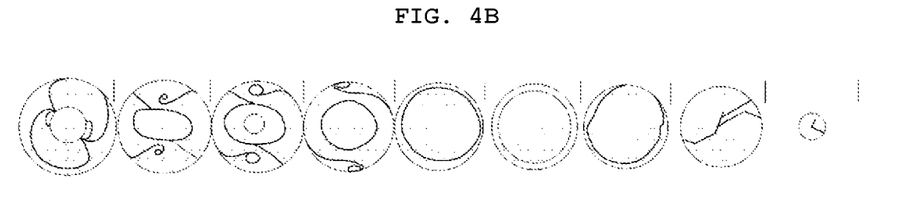
Figure 4C:
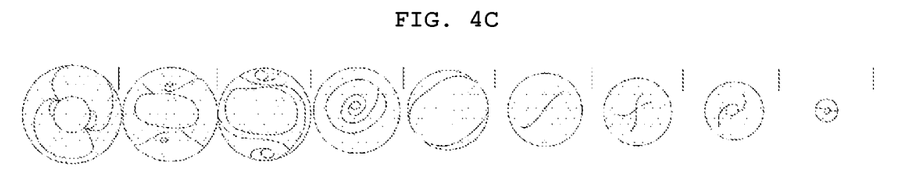

FIGS. 4A to 4C are views illustrating a flow of silicon melt together with a comparative example in a method for growing a silicon single crystal ingot according to an embodiment.

A left side illustrates a flow of the silicon melt on a surface of the silicon melt and a flow in a lower region toward the right side, and the utmost right side represents a flow of the silicon melt at the bottom surface of the crucible.

In the first and second embodiments of FIGS. 4B and 4C, particularly in a method of growing a silicon single crystal ingot according to the first embodiment, a pattern of flow of the silicon melt is maintained in the lower region. On the other hand, in the related art, a pattern of flow of the silicon melt may be blurred at the bottom.

Figure 5A:
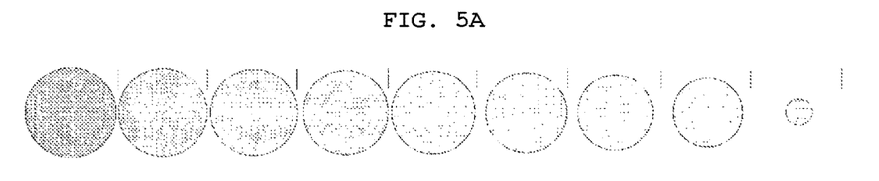
FIGS. 5A to 5C are views illustrating a distribution of oxygen in silicon melt together with a comparative example in a method for growing a silicon single crystal ingot according to an embodiment.
Figure 5B:
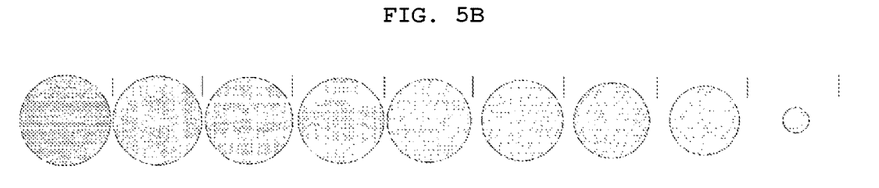
Figure 5C:
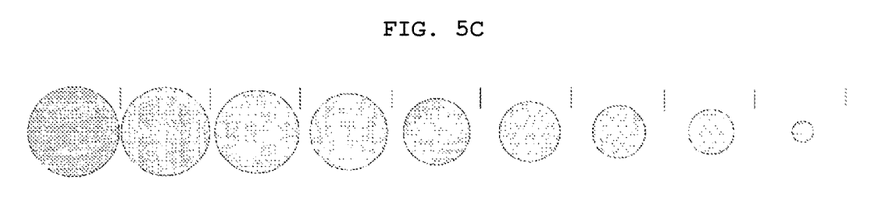

FIGS. 5A to 5C are views illustrating a distribution of oxygen in silicon melt together with a comparative example in a method for growing a silicon single crystal ingot according to an embodiment. In FIGS. 5B and 5C, a diffusion boundary layer is maintained at an edge of the ingot and a variation in speed of the silicon melt is suppressed so that oxygen concentration is uniform up to 2200 mm in a depth direction. On the other hand, in the case of the comparative example of FIG. 5A, a flow of the silicon melt is not constant and the oxygen concentration may not be uniform at 2000 mm in the depth direction.

Figure 6A:
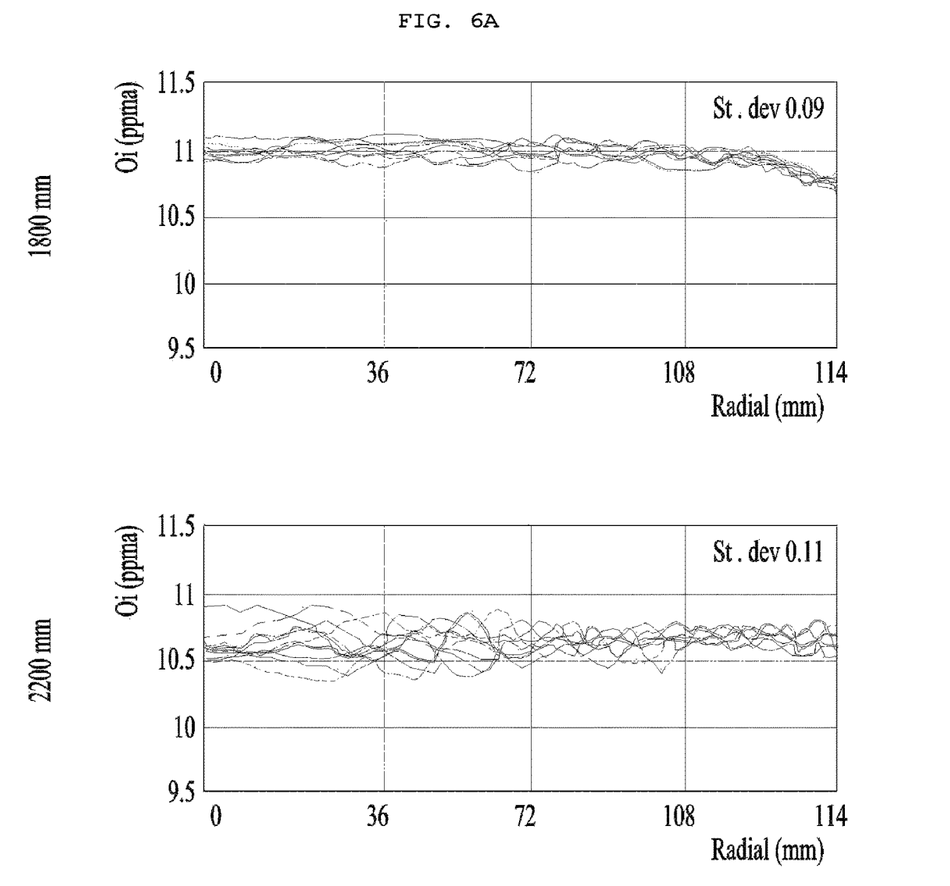
FIG. 6A is a diagram illustrating a uniformity of oxygen concentration in a method for growing a silicon single crystal ingot according to an embodiment.
Figure 6B:
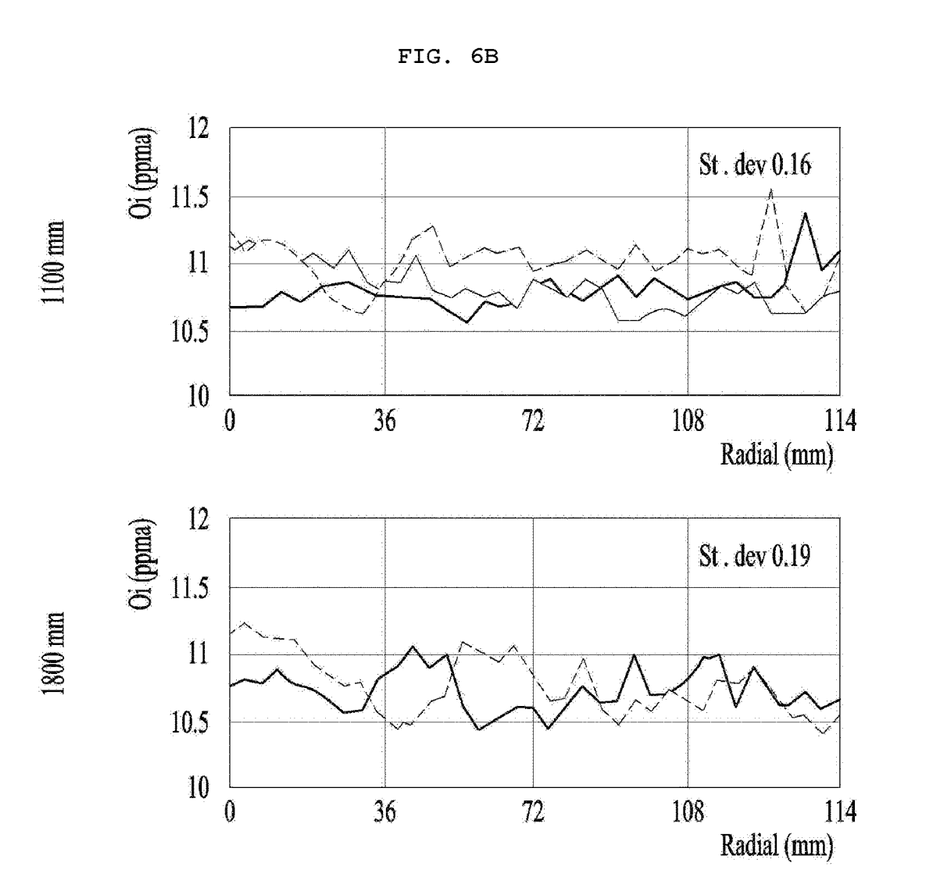
FIG. 6B is a diagram illustrating a uniformity of oxygen concentration in a method for growing a silicon single crystal ingot according to a comparative example.

FIG. 6A is a diagram illustrating a uniformity of oxygen concentration in a method for growing a silicon single crystal ingot according to an embodiment, and FIG. 6B is a diagram illustrating a uniformity of oxygen concentration in a method for growing a silicon single crystal ingot according to a comparative example.

In FIG. 6A, silicon wafers are 1800 and 2200 mm in length, respectively and 0.09 and 0.11 in resistivity, respectively, and oxygen concentration of the silicon wafers manufactured from one ingot is almost uniform in a radial direction. In FIG. 6B, silicon wafers are 1100 and 1800 mm in length and 0.16 and 0.19 in resistivity, respectively, and oxygen concentration of the silicon wafers manufactured from one ingot represents a large dispersion in a radial direction.

When a silicon single crystal ingot is grown by the process according to the embodiment described above, it can be seen that a flow of the silicon melt may be constant, so that the diffusion boundary layer may be distributed at an edge of the ingot, and the oxygen concentration of the manufactured silicon wafer may be constant, and thus resistivity may be improved.

Although embodiments have been mostly described above, they are only examples and do not limit the present invention and a person skilled in the art may appreciate that several variations and applications not presented above may be made without departing from the essential characteristic of embodiments. For example, each of components described in detail in the embodiment may be implemented in a modifiable manner. Also, it should be construed that differences related to such variations and applications are included in the scope of the present invention defined in the appended claims.

INDUSTRIAL APPLICABILITY

In an embodiment, an apparatus and method for growing a silicon single crystal ingot may improve a uniformity of oxygen concentration in diameter and radial directions in the silicon single crystal ingot.

The invention claimed is:

1. A method of growing an ingot by immersing a seed crystal in silicon melt in a crucible and slowly pulling up the seed crystal to grow the ingot, comprising:
    rotating the ingot in a specific direction;
    rotating the crucible in the specific direction; and
    heating a periphery of the crucible such that a maximum heat generating position is provided 100 mm to 200 mm below a maximum gauss position (MGP), and
    wherein the crucible is heated such that a diffusion boundary layer is uniformly distributed at an edge of a radial direction of the silicon melt.

2. The method of claim 1, wherein the diffusion boundary layer is distributed in a region having a diameter of 300 mm or more.

3. The method of claim 1, wherein a flow of the silicon melt is constant in a depth direction in the silicon melt.

4. The method of claim 1, wherein the crucible is elevated such that an interface between the ingot and the silicon melt is maintained at a same height.

5. The method of claim 1, wherein the diffusion boundary layer is provided 12 mm below an interface between a surface of the silicon melt and the ingot.

6. The method of claim 1, wherein the maximum gauss position corresponds to a region of the crucible having a strongest magnetic field intensity.

* * * * *